United States Patent [19]

Beaubien et al.

[11] Patent Number: 4,700,462

[45] Date of Patent: Oct. 20, 1987

[54] PROCESS FOR MAKING A T-GATED TRANSISTOR

[75] Inventors: Randall S. Beaubien, Westlake Village; Lorri A. Erps, Pleasanton, both of Calif.

[73] Assignee: Hughes Aircraft Company, Los Angeles, Calif.

[21] Appl. No.: 916,592

[22] Filed: Oct. 8, 1986

[51] Int. Cl.$^4$ .......................................... H01L 21/285
[52] U.S. Cl. ................................ 437/187; 156/659.1; 437/229; 437/40
[58] Field of Search .................... 29/571, 591, 578; 156/659.1; 427/88

[56] References Cited

U.S. PATENT DOCUMENTS

| | | | |
|---|---|---|---|
| 4,283,483 | 8/1981 | Coane | 427/88 X |
| 4,442,590 | 4/1984 | Stockton et al. | 29/571 |
| 4,459,321 | 7/1984 | Kim | 156/659.1 X |
| 4,489,101 | 12/1984 | Shibata | 156/659.1 X |
| 4,497,684 | 2/1985 | Sebesta | 156/659.1 X |
| 4,532,004 | 7/1985 | Akiyama et al. | 29/571 X |
| 4,536,942 | 8/1985 | Chao et al. | 29/571 X |
| 4,551,905 | 11/1985 | Chao et al. | 29/591 X |
| 4,584,763 | 4/1986 | Jambotkar et al. | 29/578 |
| 4,592,132 | 6/1986 | Lee et al. | 29/578 X |
| 4,599,790 | 7/1986 | Kim et al. | 29/571 |
| 4,618,510 | 10/1986 | Tan | 156/659.1 X |

Primary Examiner—George T. Ozaki
Attorney, Agent, or Firm—Wanda K. Denson-Low; A. W. Karambelas

[57] ABSTRACT

A process for preparing a T-gate structure for use in applying a gate voltage in a field effect transistor, wherein the gate has a short foot portion in contact with the semiconductor substrate for a short gate length and consequent low capacitance, and a large amount of metal in a contact head portion for gate low resistance. An electron beam resist technique is used to define the foot and head profiles, and a dry etch technique is used to transfer the foot profile to a dielectric later overlying the substrate. Metal is deposited into the profile pattern thus defined to form the head and the foot, and excess metal is removed by lifting off the electron beam resist layer. The remaining elements of the field effect transistor are fabricated either before, in steps intermixed with, or after the T-gate is deposited.

10 Claims, 2 Drawing Figures

PROCESS FOR MAKING A T-GATED TRANSISTOR

BACKGROUND OF THE INVENTION

This invention relates to semiconductor transistors, and, more particularly, to gate electrodes for field effect transistors.

Semiconductor transistors are found in nearly all electronic devices. They can be made in miniature forms useful in integrated circuits and other electronic packages of reduced size. The introduction of the transistor and its continuing development in ever-smaller forms is one of the major factors in the growth in popularity of consumer devices such as hand-held calculators and personal computers, and in sophisticated business and military electronic systems.

The operation of small-scale transistors is generally understood from the point of theory, but it remains to develop the fabrication techniques for constructing the devices reproducibly and reliably, on a commercial basis. As the size of the transistors is reduced, many of the fabrication techniques routinely employed in preparing larger devices cannot be used because they reach some inherent physical limitation. For example, visible light photoresist techniques used to fabricate larger transistors cannot be used for devices of less than a micrometer in size due to limitations imposed by optical effects. Well known fabrication techniques therefore may become obsolete as further size reductions are achieved. The effort to achieve further miniaturization is therefore closely linked to the development of processes for preparing the desired structures.

One important type of transistor is the field effect transistor, of which there are a number of varieties. The metal-semiconductor field effect transistor, or MESFET, is a voltage controlled variable resistor. A controllable electrical current can be established between source and drain electrodes of the MESFET, with the current controlled by a voltage applied to a gate electrode that is positioned on the semiconductor substrate between the source and drain electrodes.

Field effect transistors can be fabricated from many types of semiconductor materials. Gallium arsenide is a semiconductor having excellent properties for use at high frequencies. Gallium arsenide MESFETs are of particular interest for use in electronic circuits for low-noise amplification of signals, high-efficiency power generation, and high-speed logic devices, among others. Investigations directed at reducing the size of gallium arsenide MESFETs for use in integrated circuits and other applications are ongoing.

The performance of MESFETs is determined in part by the dimensions, electrical resistance, and capacitance of the gate electrode. Higher resistance and capacitance of the gate electrode are undesirable, because they reduce the high frequency performance of the MESFET in circuits. As the length of the contact surface or gate of the electrode parallel to the direction of current flow is reduced, the resistance of the gate electrode increases and its capacitance decreases. That is, as the gate length is made shorter, its resistance rises and becomes the dominant factor in limiting the operating frequency of the MESFET. As the size of MESFETs is reduced, the necessary reduction in the size of the gate can therefore limit its performance and effectively prevent further reduction in size.

Various geometrical arrangements and related techniques for preparing the gate electrode have been proposed, with the result that the gate length has been reduced to about 2500 Angstroms in the current art. Gates of this length can be fabricated reasonably reliably, and the resulting devices have acceptable performance. It is, of course, of interest to reduce the size of the field effect transistor, the gate, and the gate electrode even further, to permit even higher frequency operation and greater density of devices in integrated circuits. To achieve further miniaturization, it is necessary to reduce the gate length without unduly increasing the gate electrode resistance, but no approach and fabrication process for achieving this result, where the fabrication process can achieve acceptably high device yields, has been proposed.

Accordingly, there exists a need for a gate electrode geometry and fabrication techinque that permits the commercial-scale fabrication of smaller gates for the use in field effect transistors and possibly other electronic devices. The present invention fulfills this need, and further provides related advantages.

SUMMARY OF THE INVENTION

The present invention is embodied in a multistep process for fabricating electrodes for semiconductor devices, and particularly for fabricating gate electrodes for field effect transistors. Very small gate lengths as low as about 1000 Angstroms have been achieved using the process of the invention, with acceptable resistance and capacitance of the gate electrode. The process can be practiced largely with individual steps that are known in the art, and is fully compatible with related processing of field effect transistors and other circuit elements.

In accordance with the invention, a process for preparing a T-gate electrode for use in a semiconductor device, the T-gate having a foot in contact with a semiconductor substrate and an enlarged head upon the foot and integral therewith, comprises the steps of furnishing a semiconductor substrate; depositing a dielectric layer overlying the substrate; depositing an electron beam resist layer overlying the dielectric layer; exposing a linear pattern onto the resist layer with a focussed electron beam, the linear pattern having a central highly exposed region and a peripheral lesser exposed region; developing a line profile in the resist layer corresponding to the highly exposed region, by removing a portion of the resist layer lying in the highly exposed region of the electron beam; transferring the line profile to the dielectric layer by a dry etching process, by removing a portion of the dielectric layer lying under the line profile in the resist layer, the transferred line profile being the profile of the foot of the T-gate; developing a head profile in the resist layer, by removing a portion of the resist layer lying in the peripheral lesser exposed region of the electron beam; depositing a metal layer overlying the resist layer, thereby depositing metal into the foot profile and the head profile; and removing the resist layer, thereby also removing the portion of the metal layer not within the foot profile and the head profile.

The T-gate electrode gate structure permits a short contact length between the foot or downwardly extending central portion of the T, and the surface of the semiconductor. This contact length forms the gate for the field effect transistor, and can be made reproducibly in the short length. The head or cross piece of the T contains a larger volume of metal than might be otherwise expected for the short gate length, thereby decreasing the electrical resistance of the T-gate electrode.

In fabricating the T-gate electrode on the surface of the semiconductor substrate, the dielectric layer is first deposited overlying the substrate, and then the electron beam positive resist material is deposited overlying the dielectric layer. A line pattern is exposed into the resist layer with a single pass of a focussed electron beam, so that the central regions of the exposed volume is highly exposed and the adjacent peripheral regions are significantly less heavily exposed. This gradient in exposure results primarily from natural beam dispersion in the resist material.

The line profile of the highly exposed region is developed using standard electron beam resist development procedures, typically wet chemical development. The result is a sharply defined, narrow line profile extending downwardly to the dielectric layer. This line profile is transferred to the dielectric layer using dry etching techniques, such as reactive ion etching, which permit transfer of a sharply defined profile rather than a profile that is ragged, undercut, or diffused due to chemical effects.

A wider profile for the head of the T-gate is developed in the region of lesser electron beam exposure in the resist material, using the standard development techniques such as wet chemical development that do not attack the dielectric layer and its foot profile. There is a slight undercutting of the resist material due to the dispersion of the electron beam. A layer of metal is deposited over the top of the resulting structure, resulting in a head of greater width than the foot, and also having a profile that has a decreasing width with increasing distance above the foot. This shape is a consequence of the undercutting of the resist layer and the gradual closing and growing together of the metal layer as it is built up. Thus, instead of the closing action working against the formation of the foot of the gate, as is usually the case, the gradual closing is intentionally used to shape the head of the T-gate electrode. Optionally, the dielectric layer can also be removed.

The other elements of the field effect transistor or other semiconductor device are fabricated in steps that can be conducted prior to, interspersed with, or after the processing described above for fabricating the gate structure. That is, it may be necessary to conduct some of the other device preparation steps before the T-gate electrode is fabricated. If the substrate is a composite substrate of several layers of semiconductor material, the preparation of the composite substrate will normally be accomplished prior to fabricating the gate electrode. Some steps may be done after the gate electrode is deposited. The source and drain electrodes can be deposited on the surface of the semiconductor after the gate electrode is complete. It is also possible that the gate fabrication steps may be interspersed with steps for fabricating other elements of the field effect transistor, or even elements of other devices of an integrated circuit, if the economics and processing requirements so dictate. As long as the other process steps do not interfere with the preparation of the T-gate electrode in the manner described, all such arrangements are acceptable.

The present technique is particularly suitable for fabricating T-gate electrodes for gallium arsenide field effect transistors. In the preferred embodiment, the substrate is gallium arsenide, the dielectric is silicon dioxide, silicon nitride or silicon oxynitride, and the gate electrode is formed of multiple layers of titanium, platinum and gold. The line profile is transferred to the silicon dioxide with a $CHF_3$ reactive ion etch.

It will now be appreciated that the process of the present invention is a significant advancement in the art of semiconductor devices. Submicron gates can be fabricated in gallium arsenide and other semiconductor devices, with a sufficient mass of metal in the gate electrode to reduce the resistance of the electrode to acceptable levels. The process has a higher yield of successfully fabricated devices than do other techniques, and the T-gate electrodes are well suited for permitting increased miniaturization of the devices. Other features and advantages of the invention will be apparent from the following more detailed description, taken in conjunction with the accompanying drawings, which description illustrates, by way of example, the principles of the invention.

DETAILED DESCRIPTION OF THE PREFERRED EMBODIMENT

Figure 1:
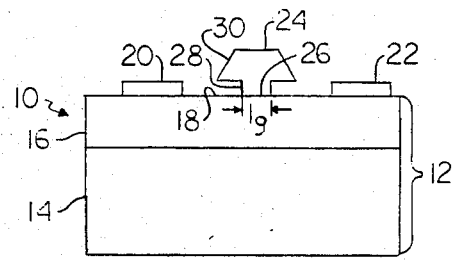
FIG. 1 is a side sectional view of an enhancement type MESFET with a gate electrode in accordance with the invention.

By way of background, FIG. 1 illustrates an enhancement-mode gallium arsenide MESFET 10 of the type fabricated in part with a preferred embodiment of the invention. The MESFET 10 includes a substrate 12 having a base 14 of gallium arsenide single crystal and a doped layer 16 of gallium arsenide overlying the base 14. The doped layer 16 can be n-doped or p-doped.

Three electrodes are contacted to an upper surface 18 of the substrate 12. A source electrode 20 and a drain electrode 22 are deposited some distance apart. A gate electrode, here illustrated as a T-gate electrode 24 of the invention, is positioned between the source electrode 20 and the drain electrode 22. The T-gate electrode 24 contacts the substrate 12 along a surface that is the gate 26, and the contact length is defined as the gate length $l_g$. The downwardly extending portion of the T, having a lateral dimension of $l_g$, is termed a foot 28 of the T-gate electrode 24. The cross piece of the T, which in reality is shaped somewhat like the head of a mushroom, is termed a head 30.

Figure 2:
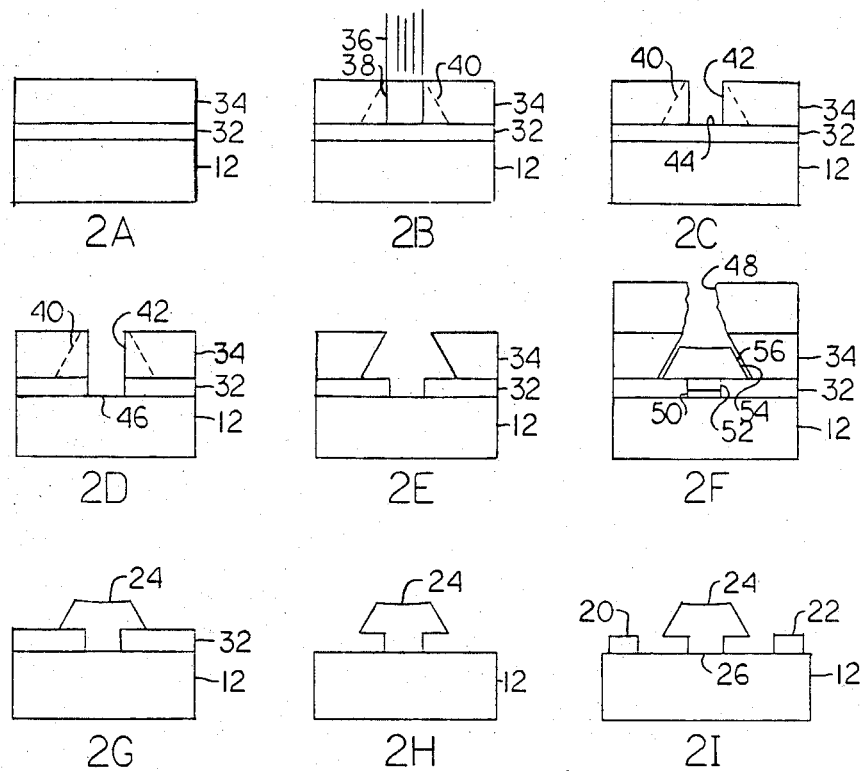
FIGS. 2A-I are a schematic process flow diagram of the preferred process of the invention, illustrating the device structure at each stage.

FIG. 2 illustrates the preferred embodiment of the process of the invention. On an n-doped gallium arsenide substrate 12, a dielectric layer 32 of silicon dioxide about 1500 Angstroms thick is deposited by chemical vapor deposition or magnetron sputtering. Other dielectric layer materials are silicon nitrate and silicon oxynitride. Overlying the dielectric layer 32 is deposited an electron beam positive resist layer 34 about 5000 Angstroms thick. The resulting multilayer material (FIG. 2A) is the starting point for the formation of the T-gate electrode 24.

An electrode beam 36 of energy about 20 kilovolts is passed linearly across the width of the finished MESFET 10, exposing a stripe on the resist layer 34 (FIG. 2B). The electron beam exhibits some dispersion in the resist, and is naturally and intentionally slightly defocused. The resulting pattern in the resist layer 34 is a highly exposed region 38 and a pair of adjacent, peripheral lesser exposed regions 40.

The highly exposed region 38 is developed in the resist layer 34 by standard techniques, and resist material removed therefrom to define a foot recess 42 (FIG. 2C). The recess bottom 46 defines a line profile 44 of the exact shape and size of the gate 26 to be eventually fabricated.

More specifically, the preferred electron beam resist material is polymethyl methacrylate (PMMA). The highly exposed region 38 may receive a dosage of about 100 microcuries per square centimeter. The highly exposed region 38 can be removed by immersion in a liquid solvent developer mixture of one part methyl isobutyl ketone (MIBK) to one part isopropyl alcohol (IPA), for a time sufficient to remove the highly exposed region 38, typically about one minute. The lesser exposed regions 40 are not significantly attacked by this diluted developer.

The pattern of the line profile 44 is transferred into the dielectric layer 32 by reactive ion etching in $CHF_3$ gas (FIG. 2D). A voltage is applied to the substrate 12 in the gaseous atmosphere, and the silicon dioxide exposed due to the removal of the material in the foot recess 42, along the line profile 44, is etched away. This material etching technique is a dry technique, and removes a substantially straight-sided thickness of the silicon dioxide so that the line profile 44 is extended vertically downwardly to the surface of the substrate 12 at 46. By contrast, wet chemical techniques used in this step would cause undercutting of the resist layer 34, so that the shape of the gate 26 would be uneven and irregular. This step thus precisely defines shape and size of the foot 28 of the final T-gate electrode 24.

The remaining portion of the volume to be occupied by the T-gate electrode 24 is removed from the resist layer 34 by developing and removing the lesser exposed region 40 (FIG. 2E). The lesser exposed region 40 can be removed by immersion in a liquid solvent developer of undiluted MIBK for a time sufficient to remove the electron beam resist to a desired width. As discribed above, the resist layer 34 is somewhat undercut naturally by the dispersion of the electron beam 36, and this undercut structure is developed in the resist layer 34 and a corresponding portion of the resist layer 34 removed in this step.

A metal layer 48 is then deposited over the resist layer 34 by vacuum evaporation (FIG. 2F). Preferably, three sublayers of metal are evaporated to form the T-gate electrode 24, First, an adhesion sublayer 50 of titanium is deposited to promote adhesion of the electrode 24 to the substrate. Then a diffusion barrier sublayer 52 of platinum is deposited over the adhesion sublayer 50, and finally a contact sublayer 54 of gold is deposited over the diffusion barrier sublayer 52. Preferably, the sublayer 50 is about 500 Angstroms thick, the sublayer 52 is about 1000 Angstroms thick, and the sublayer 54 is about 3000 Angstroms thick. The diffusion barrier sublayer 52 prevents gold from diffusing into the adhesion sublayer 50, so that the Schottky barrier at the interface of the adhesion sublayer 50 and the substrate 12 is not contaminated. It will be appreciated that other metallizations can be used, and that the approach just described is the preferred approach. The shape of the foot 28 of the T-gate electrode 24 is defined by the filling with metal of the portion of the dielectric layer 32 previously removed by the reactive ion etch. The shape of the head 30 is defined by the progressive change of the opening through which the metal is evaporated.

As metal is evaporated onto the resist layer 34, some penetrates to the surface of the substrate 12 through the opening previously removed by the two development processes and the ion etch. The recess bottom 46 is filled, and the foot 28 is filled. As the thickness of metal builds up, the dimension of the opening 48 in the metal layer 50 gradually becomes smaller. The progressive closing causes the dimension of the head 30 to become gradually narrower, since the dimension of the head at any moment is about that of the opening 48. The result is that the head 30 has inwardly sloping sides 56, the most desirable shape for the head 30. When metal of the desired thickness of the head 30 has been accumulated, the metal deposition is discontinued. Typically, the dimensions of the T-gate electrode are $l_g$ about 1000–2500 Angstroms, the transverse dimension of the head 30 at its maximum point about 4000–6000 Angstroms, and the total height of the T-gate electrode about 4500 Angstroms.

The resist layer 34 is then removed (FIG. 2G) by standard techniques for that resist material. For the preferred electron beam resist of PMMA, the resist layer 34 can be removed by immersion in a solvent such as acetone. The metal layer 50 overlying the resist layer 34 is also removed or "lifted off" by this process. Optionally, the dielectric layer 32 can also be removed, if the finished field effect transistor does not require such a layer. In the case of the MESFET 10, the dielectric silicon dioxide layer 32 is removed by etching in a dilute hydrofluoric acid solution.

In the case of the simple MESFET 10 of the presently preferred embodiment, the T-gate electrode 24 can be fabricated to its final form prior to adding the source and drain electrodes 20 and 22 (FIG. 2H). The electrodes 20 and 22 are then deposited onto the top of the substrate 12 by conventional masking and vacuum evaporation, to produce the final MESFET 10 (FIG. 2I).

It will now be appreciated that the process, T-gate electrode, and semiconductor devices of the invention present a significant advance in the field of semiconductor devices, particularly in respect to reducing the sizes of the devices in the submicron range. As a result, more devices can be packed into an available area. The speed of the devices is therefore increased. By reducing the gate length, the high frequency performance of gallium arsenide and other field effect transistors is improved.

Although a particular embodiment of the invention has been described in detail for purposes of illustration, various modifications may be made without departing from the spirit and scope of the invention. Accordingly, the invention is not to be limited except as by the appended claims.

What is claimed is:

1. A process for preparing a T-gate metal structure for use in a semiconductor device, the T-gate having a foot in contact with a semiconductor substrate and an enlarged head upon the foot and integral therewith, comprising the steps of:
   furnishing a semiconductor substrate;
   depositing a dielectric layer overlying the substrate;
   depositing an electron beam positive resist layer overlying the dielectric layer;
   exposing a linear pattern into the resist layer with a focused electron beam, the linear pattern having a central highly exposed region and a peripheral lesser exposed region;

developing a line profile in the resist layer corresponding to the highly exposed region, by removing a portion of the resist layer lying in the highly exposed region of the electron beam;

transferring the line profile to the dielectric layer by a dry etching process, by removing a portion of the dielectric layer lying under the line profile in the resist layer, the transferred line profile being the profile of the foot of the T-gate;

developing a head profile in the resist layer, by removing a portion of the resist layer lying in the peripheral lesser exposed region;

depositing a metal layer overlying the resist layer, thereby depositing metal into the foot profile and the head profile; and removing the resist layer, thereby also removing the portion of the metal layer not within the foot profile and the head profile.

2. The process of claim 1, including the further step of removing the dielectric layer, after said step of removing the resist layer.

3. The process of claim 1, including the further step of fabricating the remaining elements of a field effect transistor into the semiconductor substrate, in combination with the T-gate forming a field effect transistor.

4. The process of claim 1, wherein said steps of developing a head profile and developing a line profile are accomplished by wet chemical procedures.

5. The process of claim 1, wherein said step of transferring is accomplished by reactive ion etching.

6. The process of claim 1, wherein the dielectric layer material is selected from the group consisting of silicon dioxide, silicon nitride, and silicon oxynitride.

7. The process of claim 1, wherein the substrate is gallium arsenide.

8. The process of claim 1, wherein said step of depositing a metal layer includes the substeps of depositing at least two metal sublayers, said sublayers together forming the metal layer.

9. The process of claim 8, wherein said substeps include the substeps of
 depositing an adhesion sublayer in contact with said substrate,
 depositing a diffusion barrier sublayer over said adhesion sublayer, and
 depositing a contact sublayer over said diffusion barrier sublayer.

10. The process of claim 9, wherein said adhesion sublayer is titanium, said diffusion barrier sublayer is platinum, and said contact sublayer is gold.

* * * * *